United States Patent
Xu

(10) Patent No.: US 10,591,786 B2
(45) Date of Patent: Mar. 17, 2020

(54) MASK STRUCTURE AND MANUFACTURING METHOD FOR ARRAY SUBSTRATE

(71) Applicant: Shenzhen China Star Optoelectronics Semiconductor Display Technology Co., Ltd., Shenzhen, Guangdong (CN)

(72) Inventor: Hongyuan Xu, Shenzhen (CN)

(73) Assignee: Shenzhen China Star Optoelectronics Semiconductor Display Technology Co., Ltd., Shenzhen, Guangdong (CN)

( * ) Notice: Subject to any disclaimer, the term of this patent is extended or adjusted under 35 U.S.C. 154(b) by 239 days.

(21) Appl. No.: 15/576,333

(22) PCT Filed: Nov. 6, 2017

(86) PCT No.: PCT/CN2017/109503
§ 371 (c)(1),
(2) Date: Nov. 22, 2017

(87) PCT Pub. No.: WO2018/233182
PCT Pub. Date: Dec. 27, 2018

(65) Prior Publication Data
US 2018/0373081 A1    Dec. 27, 2018

(30) Foreign Application Priority Data
Jun. 22, 2017    (CN) .......................... 2017 1 0479332

(51) Int. Cl.
G03F 1/50    (2012.01)
G02F 1/1343    (2006.01)
(Continued)

(52) U.S. Cl.
CPC ........ *G02F 1/13439* (2013.01); *G02F 1/1362* (2013.01); *G02F 1/1368* (2013.01);
(Continued)

(58) Field of Classification Search
CPC ........... G02F 1/13439; G02F 1/134336; G02F 2001/136236; G03F 1/50; G03F 7/20; H01L 27/1288
(Continued)

(56) References Cited

U.S. PATENT DOCUMENTS

| 2003/0091940 A1 | 5/2003 | Nakao |
| 2004/0089900 A1* | 5/2004 | Ishikawa ............... G02F 1/1368 257/347 |

(Continued)

FOREIGN PATENT DOCUMENTS

| CN | 1983033 A | 6/2007 |
| CN | 101442028 A | 5/2009 |

(Continued)

*Primary Examiner* — John A McPherson
(74) *Attorney, Agent, or Firm* — Mark M. Friedman

(57) ABSTRACT

A mask structure is provided. The mask structure includes a plurality of mask units arranged in an array. The mask units includes a first mask configured to form a first transparent electrode in a corresponding area of a surface of the array substrate, and a second mask connected with the first mask, and configured to form a second transparent electrode in a corresponding area of the surface of the array substrate. The first mask and the second mask have different light transmittances, and light transmittance of the second mask is less than light transmittance of the first mask, to allow in different amounts of light.

8 Claims, 3 Drawing Sheets

(51) Int. Cl.
*H01L 27/12* (2006.01)
*G02F 1/1368* (2006.01)
*G03F 1/32* (2012.01)
*G02F 1/1362* (2006.01)
*G03F 7/30* (2006.01)
*G03F 7/20* (2006.01)

(52) U.S. Cl.
CPC .. *G02F 1/134309* (2013.01); *G02F 1/134336* (2013.01); *G03F 1/32* (2013.01); *G03F 1/50* (2013.01); *H01L 27/124* (2013.01); *H01L 27/1288* (2013.01); *G02F 2001/136231* (2013.01); *G02F 2001/136236* (2013.01); *G02F 2201/122* (2013.01); *G02F 2201/123* (2013.01); *G03F 7/20* (2013.01); *G03F 7/2008* (2013.01); *G03F 7/30* (2013.01)

(58) Field of Classification Search
USPC .............................. 430/5, 319, 321, 396, 318
See application file for complete search history.

(56) References Cited

U.S. PATENT DOCUMENTS

| | | | | |
|---|---|---|---|---|
| 2014/0071553 | A1* | 3/2014 | Park | G02B 5/22 359/891 |
| 2014/0117371 | A1* | 5/2014 | Ma | H01L 27/124 257/72 |
| 2016/0020227 | A1* | 1/2016 | Choi | G02F 1/1362 257/43 |

FOREIGN PATENT DOCUMENTS

| | | |
|---|---|---|
| CN | 101881924 A | 11/2010 |
| JP | 2000147746 A | 5/2000 |

* cited by examiner

MASK STRUCTURE AND MANUFACTURING METHOD FOR ARRAY SUBSTRATE

FIELD OF THE INVENTION

The present disclosure relates to a technical field of liquid crystal displays, and more particularly to a mask structure and a manufacturing method for an array substrate.

BACKGROUND OF THE INVENTION

3Mask technology uses a Lift-off process to simultaneously form an indium tin oxide (ITO) layer (pixel electrode) and a passivation (PV) layer using a single mask, thereby a total number of masks can be reduced to three masks.

A traditional 3Mask process is primarily for a twisted nematic (TN) mode, wherein the ITO does not form a slit pattern. Even if the ITO forms a slit pattern, because the ITO can only be deposited into a dug hole, the entire ITO layer is inside a SiNx (silicon nitride) groove, so that a horizontal electric field of the ITO is weakened, therefore influencing the liquid crystal display, and causing unevenness display brightness. However, with development of the technology, in an improved 3Mask technology, PV/ITO layers are formed by a halftone mask (HTM mask) or a gray scale mask (GTM mask), so that an ITO of a pixel area can not only form a slit, but can also cover a PV layer, to form a structure the same as a 4Mask structure.

In this type of large area HTM mask, because it adopts a semipermeable membrane with a constant light transmittance, during a single-layer film experiment, the mask has a narrower slit causing lights to be partially diffracted, so that an amount of sensitivity of a photoresist in a corresponding area is less than an amount of sensitivity of the photoresist in other areas, and the difference of the amounts of sensitivity causes a difference of film thicknesses between the two locations of the photoresist of about 0.5 um. During a full process experiment, because a light-reflection from a drain electrode metal under a via of an array substrate, an amount of exposure of a mask in a corresponding area above the drain electrode metal is enhanced, so that the thinner photoresist in the corresponding area is thinned again, or even disappears, thereby in a following dry etching process, the ITO will be etched and weakened, causing disruption in the ITO from lower to higher surfaces.

As mentioned above, in a traditional HTM mask, because each area of the semipermeable membranes adopts the same light transmittance, when manufacturing an array substrate, film thicknesses of a photoresist in different areas on a surface of one ITO layer are different, this even causes the thinner photoresist to disappear, so that in a following dry etching process, the ITO will be etched and weakened, causing disruption in the ITO from lower to higher surfaces.

SUMMARY OF THE INVENTION

The present disclosure provides mask structure, which can accomplish that different areas of an array substrate have different amounts of light, so as to solve a technical problem: in a traditional HTM mask, because each area of the semipermeable membranes adopts the same light transmittance, when manufacturing an array substrate, film thicknesses of a photoresist in different areas on a surface of one ITO layer are different, this even causes the thinner photoresist to disappear, so that in a following dry etching process, the ITO will be etched and weakened, causing disruption in the ITO from lower to higher surfaces.

For solving the above-mentioned problem, the present disclosure provides a technical solution as follows:

The present disclosure provides a mask structure, which comprises a plurality of mask units arranged in an array and configured to form a metal pattern on a surface of an array substrate of a display panel;

wherein the mask units comprise:

a first mask configured to form a first transparent electrode in a corresponding area of the surface of the array substrate; and a second mask connected with the first mask, and configured to form a second transparent electrode in a corresponding area of the surface of the array substrate;

wherein the first transparent electrode and the second transparent electrode form the pixel electrode; and the first mask and the second mask have different light transmittances, and the light transmittance of the second mask is less than the light transmittance of the first mask, so as to allow in different amounts of light.

The first mask comprises two slit areas which are symmetrically disposed to each other; the second mask comprises a first connecting area configured to connect the two slit areas, and a second connecting area configured to connect with one end of the first connecting area.

According to one preferable embodiment of the present disclosure, the first mask and the second mask adopt a halftone mask.

According to one preferable embodiment of the present disclosure, the first mask adopts a single-slit diffraction mask, and the second mask adopts a halftone mask.

According to one preferable embodiment of the present disclosure, a width of a slit of the first mask is from 1.6 um to 1.8 um.

The first mask comprises two slit areas which are symmetrically disposed to each other, and a first connecting area configured to connect the two slit areas; and the second mask comprises a second connecting area configured to connect with one end of the first connecting area.

According to one preferable embodiment of the present disclosure, the first mask adopts a halftone mask, and the second mask adopts a single-slit diffraction mask.

The present disclosure further provides a mask structure, which comprises a plurality of mask units arranged in an array and configured to form a metal pattern on a surface of an array substrate of a display panel;

wherein the mask units comprise:

a first mask configured to form a first transparent electrode in a corresponding area of the surface of the array substrate; and a second mask connected with the first mask, and configured to form a second transparent electrode in a corresponding area of the surface of the array substrate;

wherein the first mask and the second mask have different light transmittances, and the light transmittance of the second mask is less than the light transmittance of the first mask, so as to allow in different amounts of light.

The first mask comprises two slit areas which are symmetrically disposed to each other; the second mask comprises a first connecting area configured to connect the two slit areas, and a second connecting area configured to connect with one end of the first connecting area.

According to one preferable embodiment of the present disclosure, the first mask and the second mask adopt a halftone mask.

According to one preferable embodiment of the present disclosure, the first mask adopts a single-slit diffraction mask, and the second mask adopts a halftone mask.

According to one preferable embodiment of the present disclosure, a width of a slit of the first mask is from 1.6 um to 1.8 um.

The first mask comprises two slit areas which are symmetrically disposed to each other, and a first connecting area configured to connect the two slit areas; and the second mask comprises a second connecting area configured to connect with one end of the first connecting area.

According to one preferable embodiment of the present disclosure, the first mask adopts a halftone mask, and the second mask adopts a single-slit diffraction mask.

According to the above-mentioned purpose, a manufacturing method for an array substrate is provided, wherein the manufacturing method comprises steps of:
forming a gate electrode and a gate line of a thin film transistor on a surface of a glass substrate;
forming an active layer, source electrode, drain electrode, passivation layer, and a passivation layer via on the surface of the glass substrate;
depositing a transparent metal layer on the surface of the glass substrate, and coating a photoresist on a surface of the transparent metal layer;
patterning the photoresist by the mask structure, wherein the first mask and the second mask are used to expose different areas of the photoresist, simultaneously; and
developing the photoresist to form a photoresist pattern; etching the transparent metal layer uncovered with the photoresist; and lifting off the photoresist on the transparent metal layer to form a pixel electrode pattern.

According to one preferable embodiment of the present disclosure, the first mask comprises two slit areas which are symmetrically disposed to each other; the second mask comprises a first connecting area configured to connect the two slit areas, and a second connecting area configured to connect with one end of the first connecting area.

According to one preferable embodiment of the present disclosure, the first mask and the second mask adopt a halftone mask.

The advantages of the present disclosure are that: compared with a conventional mask structure, in the present disclosure, there are two masks with different amounts of light in one mask unit, so that the present disclosure can accomplish that different areas of a photoresist on an array substrate can receive different amounts of light, so this can eliminate a problem: in a portion of the areas of the photoresist has an enhanced exposure, which is greater than other area caused by a light-reflection from an under-layer metal, and has a different height than the other area. Therefore, in different areas of the photoresist having the same height is accomplished. The present disclosure can solve a technical problem: in a traditional HTM mask, because each area of the semipermeable membranes adopts the same light transmittance, when manufacturing an array substrate, film thicknesses of a photoresist in different areas on a surface of one ITO layer are different, this even causes the thinner photoresist to disappear, so that in a following dry etching process, the ITO will be etched and weakened, causing disruption in the ITO from lower to higher surfaces.

DESCRIPTION OF THE DRAWINGS

In order to more clearly illustrate technical solutions of the embodiments or the prior art, accompany drawings which need to be used in the description of the embodiments or the prior art will be simply introduced. Obviously, the accompany drawings in the following description are merely some embodiments, and for those of ordinary skill in the art, other embodiments can further be obtained according to these accompany drawings without contributing any creative work.

DETAILED DESCRIPTION OF THE PREFERRED EMBODIMENTS

Figure 1:
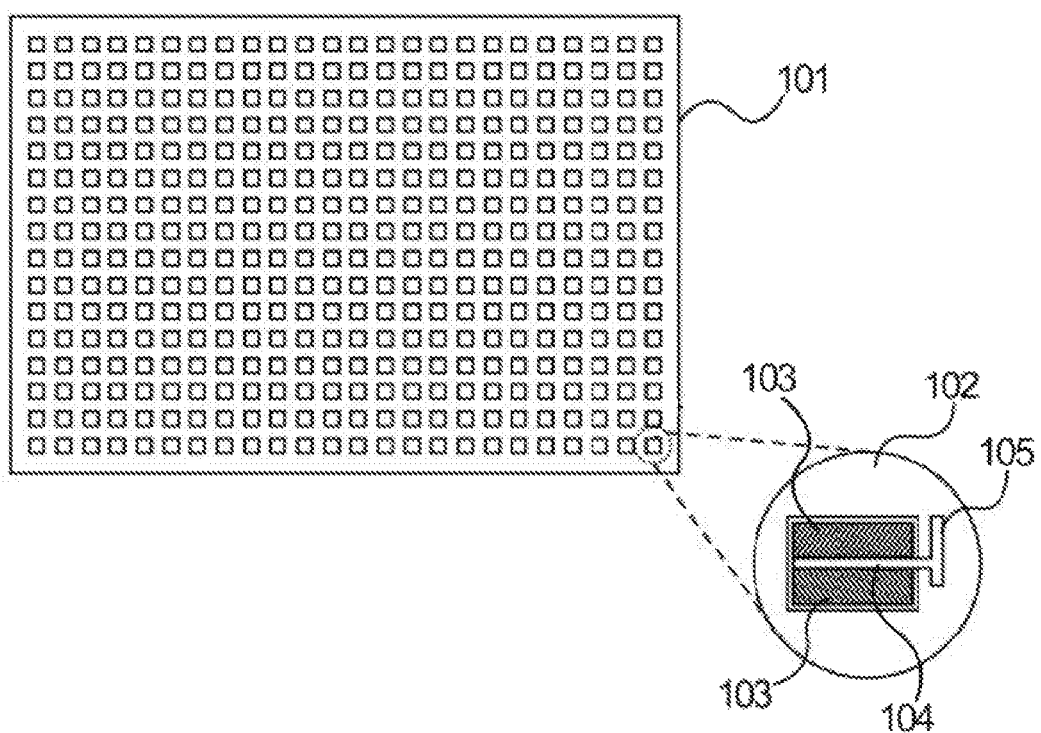
FIG. 1 is a schematic structural view of a mask structure of the present disclosure.

The foregoing objects, features, and advantages adopted by the present invention can be best understood by referring to the following detailed description of the preferred embodiments and the accompanying drawings. Furthermore, the directional terms described in the present invention, such as upper, lower, front, rear, left, right, inside, outer, side, etc., are only directions with reference to the accompanying drawings, so that the used directional terms are used to describe and understand the present invention, but the present invention is not limited thereto. In the drawings, units with similar structures use the same numerals.

The present disclosure solves a technical problem: in a traditional HTM mask, because each area of the semipermeable membranes adopts the same light transmittance, when manufacturing an array substrate, film thicknesses of a photoresist in different areas on a surface of one ITO layer are different, this even causes the thinner photoresist to disappear, so that in a following dry etching process, the ITO will be etched and weakened, causing disruption in the ITO from lower to higher surfaces. The present disclosure can solve the defects.

As shown in FIG. 1, the present disclosure provides a mask structure, which includes a transparent base 101, and a surface of the transparent base 101 is provided with a plurality of mask units 102 arranged in an array. The mask unit 102 includes an opaque area and a transparent area, wherein the transparent area is a hollow pattern. The hollow pattern can be transferred to a surface of a photoresist by exposure, and then the photoresist is developed to form a photoresist pattern. After that, a portion of a transparent metal layer uncovered with the photoresist is etched, and then the photoresist on the surface of the transparent metal layer is lifted off, so as to form an electrode pattern.

An array substrate with 3Mask technology includes a glass substrate and thin film transistors arranged on a surface of the glass substrate in an array. The thin film transistor includes a metal opaque layer formed on the surface of the glass substrate; an active layer located on the metal opaque layer; a gate electrode located on the active layer; a source electrode located on the gate electrode and connected with one side of the active layer; and a drain electrode connected with another side of the active layer. Surfaces of the source and drain electrodes are provided with a passivation layer, and a surface of the passivation layer is provided with a pixel electrode. A pixel electrode via is disposed in the passivation layer corresponding to a drain area of the thin film transistor, and the pixel electrode via is configured to accomplish an electrical connection between the pixel electrode and the drain electrode of the thin film transistor.

The pixel electrode includes a slit area configured to form an electric field for driving liquid crystal to twist; a connecting area configured to connect with the drain electrode of the thin film transistor, wherein the connecting area is located on the pixel electrode via.

The mask unit 102 includes a first mask and a second mask. The first mask is configured to form a first transparent electrode in a corresponding area of a surface of the array substrate. The second mask is connected with the first mask, and is configured to form a second transparent electrode in a corresponding area of the surface of the array substrate. The first transparent electrode and the second transparent electrode form the pixel electrode.

The first mask includes two slit areas 103 which are symmetrically disposed to each other. The second mask includes a first connecting area 104 configured to connect the two slit areas; and a second connecting area 105 configured to connect with one end of the first connecting area 104.

The first mask and the second mask have different light transmittances, and the light transmittance of the second mask is less than the light transmittance of the first mask. This is configured to allow in different amounts of light, so that an enhanced exposure caused by a light-reflection from a metal under the second transparent electrode can be eliminated. That is, a photoresist on a surface of the first transparent electrode and a photoresist on a surface of the second transparent electrode have different heights.

Figure 2:
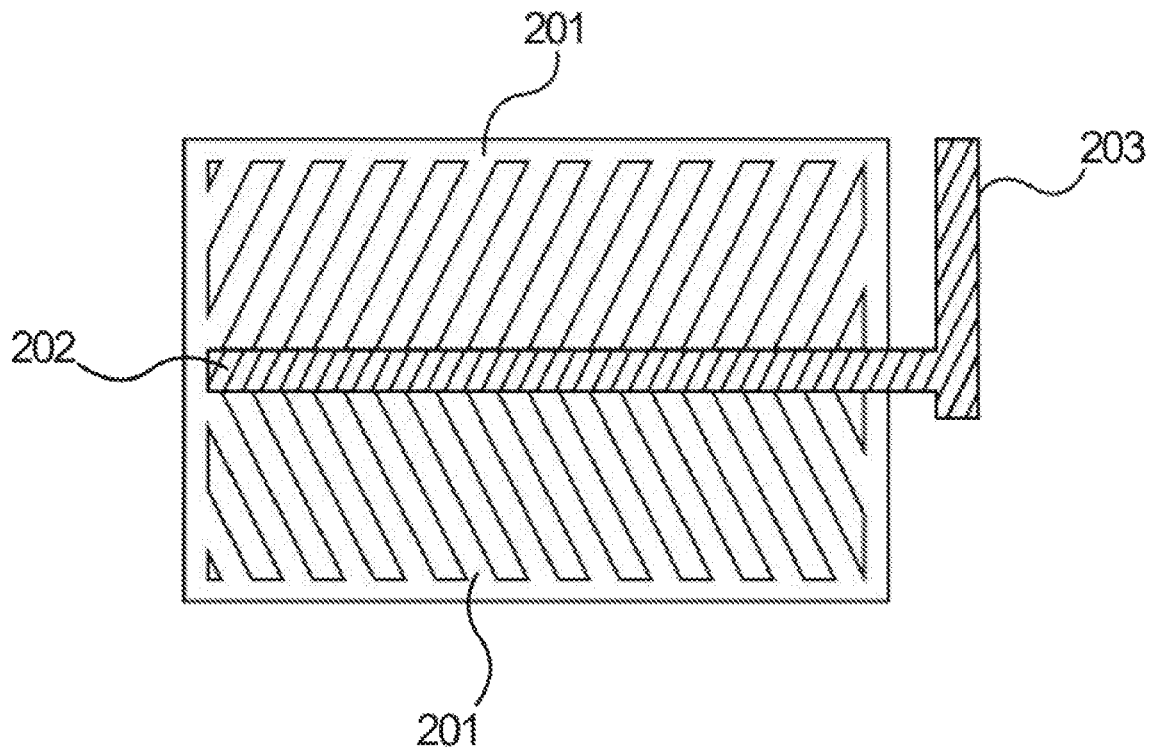
FIG. 2 is a schematic structural view of a mask unit of the mask structure of the present disclosure.

As shown in FIG. 2, a mask unit of the mask structure of the present disclosure includes a first mask and a second mask.

The first mask includes two slit areas 201 which are symmetrically disposed to each other. The second mask includes a first connecting area 202 configured to connect the two slit areas 201; and a second connecting area 203 configured to connect with one end of the first connecting area 202.

The two slit areas 201 of the first mask are configured to form slit electrodes of the pixel electrode in a corresponding area on a surface of the array substrate; the first connecting area 202 of the second mask is configured to form a first connecting electrode for connecting two of the slit electrodes; the second connecting area 203 of the second mask is configured to form a second connecting electrode, and the second connecting electrode is configured to accomplish a connection between the first connecting electrode and the drain electrode of the thin film transistor.

Both the first mask and the second mask adopt a halftone mask, wherein the first mask adopts a first semipermeable membrane, and the second mask adopts a second semipermeable membrane. The first semipermeable membrane adopts a normal light transmittance, and a light transmittance of the second semipermeable membrane is less than the normal light transmittance, namely, an amount of light of the second mask is decreased.

When used, the amount of light of the second mask is decreased, but a light-reflection from a metal under the second mask will enhance the exposure, so that an amount of light received by a photoresist with an area corresponding to the second mask 202 and an amount of light received by a photoresist with an area corresponding to the first mask 202 are balanced. Therefore, the areas corresponding to an exposed photoresist have the same film thickness, and it can avoid a problem: when the photoresist corresponding to the area of the second mask is completely exposed, an under-layer metal is exposed, thereby the under-layer metal will be weakened during a dry etching process.

Figure 3:
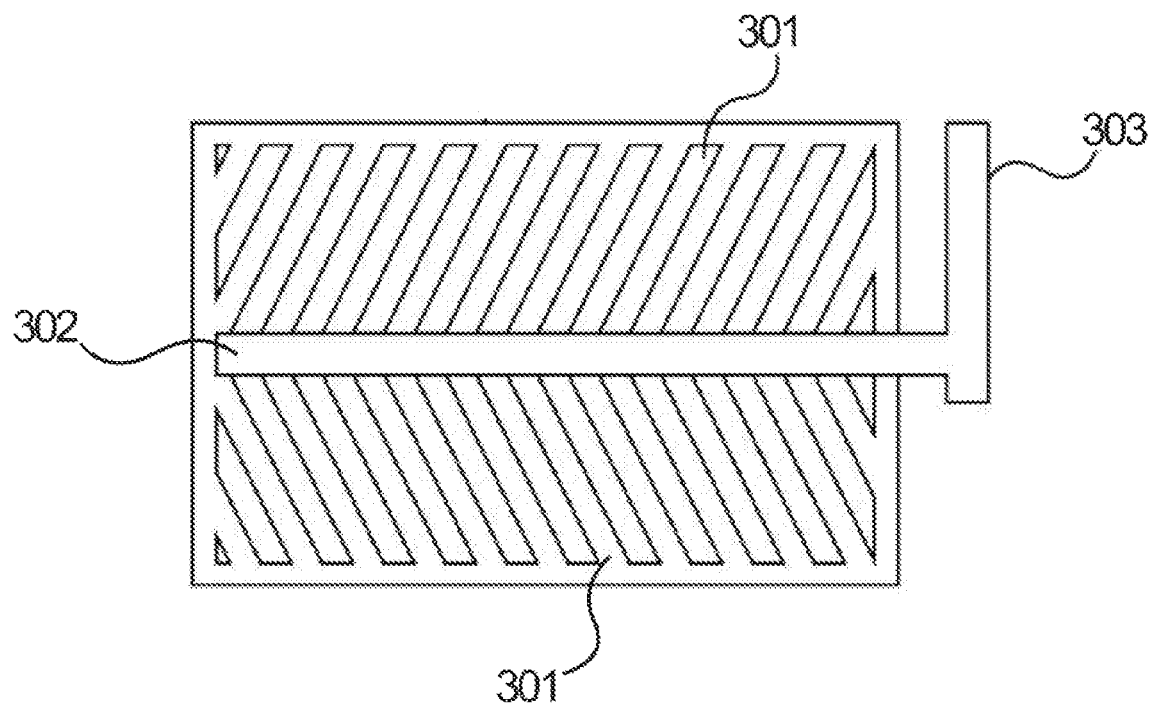
FIG. 3 is a schematic structural view of another mask unit of the mask structure of the present disclosure.

As shown in FIG. 3, a mask unit of the mask structure of the present disclosure includes a first mask and a second mask.

The first mask includes two slit areas 301 which are symmetrically disposed to each other. The second mask includes a first connecting area 302 configured to connect the two slit areas 301; and a second connecting area 303 configured to connect with one end of the first connecting area 302.

The two slit areas 301 of the first mask are configured to form slit electrodes of the pixel electrode in a corresponding area on a surface of the array substrate; the first connecting area 302 of the second mask is configured to form a first connecting electrode for connecting two of the slit electrodes; the second connecting area 303 of the second mask is configured to form a second connecting electrode, and the second connecting electrode is configured to accomplish a connection between the first connecting electrode and the drain electrode of the thin film transistor.

The first mask adopts a single-slit diffraction mask, and the second mask adopts a halftone mask, wherein a light transmittance of a semipermeable membrane of the second mask is less than a light transmittance of a normal semipermeable membrane. For a better diffraction effect, a width of a slit of the first mask is set between 1.6 um-1.8 um. Therefore, the first mask and the second mask have different light transmittances, so as to accomplish that the first mask and the second mask have different amounts of light, and corresponding areas of an exposed photoresist have the same film thickness.

Figure 4:
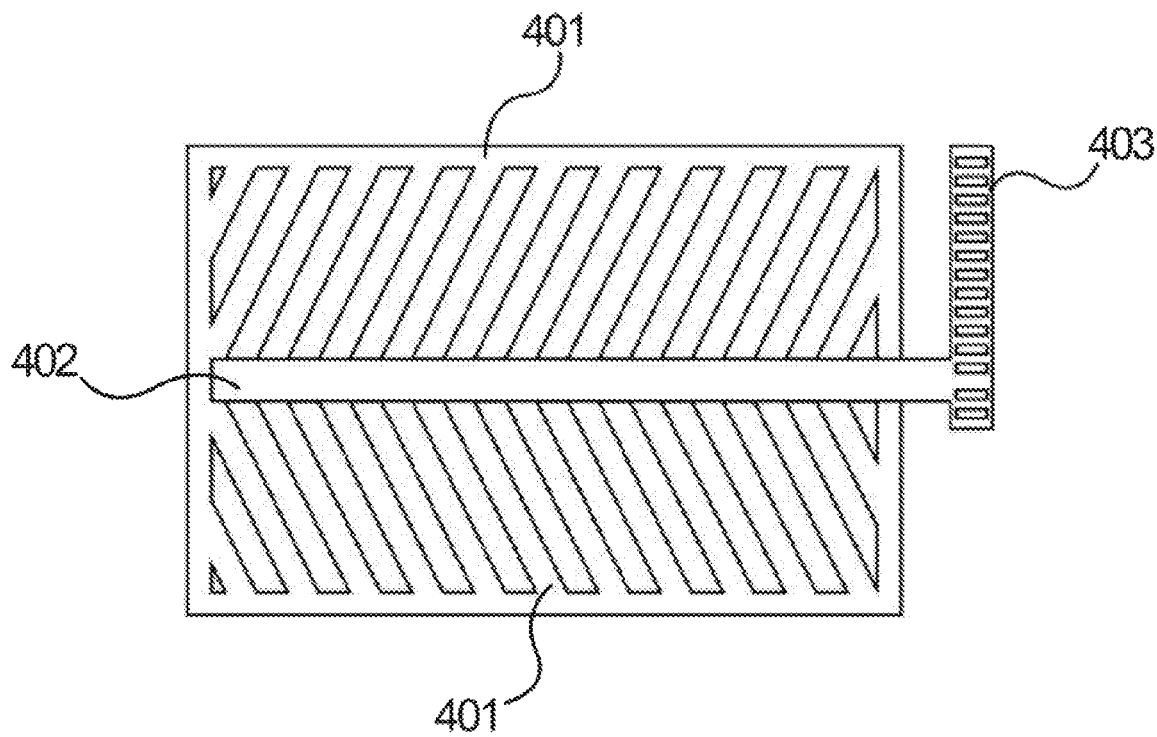
FIG. 4 is a schematic structural view of one more mask unit of the mask structure of the present disclosure.

As shown in FIG. 4, a mask unit of the mask structure of the present disclosure includes a first mask and a second mask.

The first mask includes two slit areas 401 which are symmetrically disposed to each other, and a first connecting area 402 configured to connect the two slit areas 401. The second mask includes a second connecting area 403 configured to connect with one end of the first connecting area 402.

The two slit areas 401 of the first mask are configured to form slit electrodes of the pixel electrode in a corresponding area on a surface of the array substrate; the first connecting area 402 of the first mask is configured to form a first connecting electrode for connecting two of the slit electrodes; the second connecting area 403 of the second mask is configured to form a second connecting electrode, and the second connecting electrode is configured to accomplish a connection between the first connecting electrode and the drain electrode of the thin film transistor.

Figure 5:
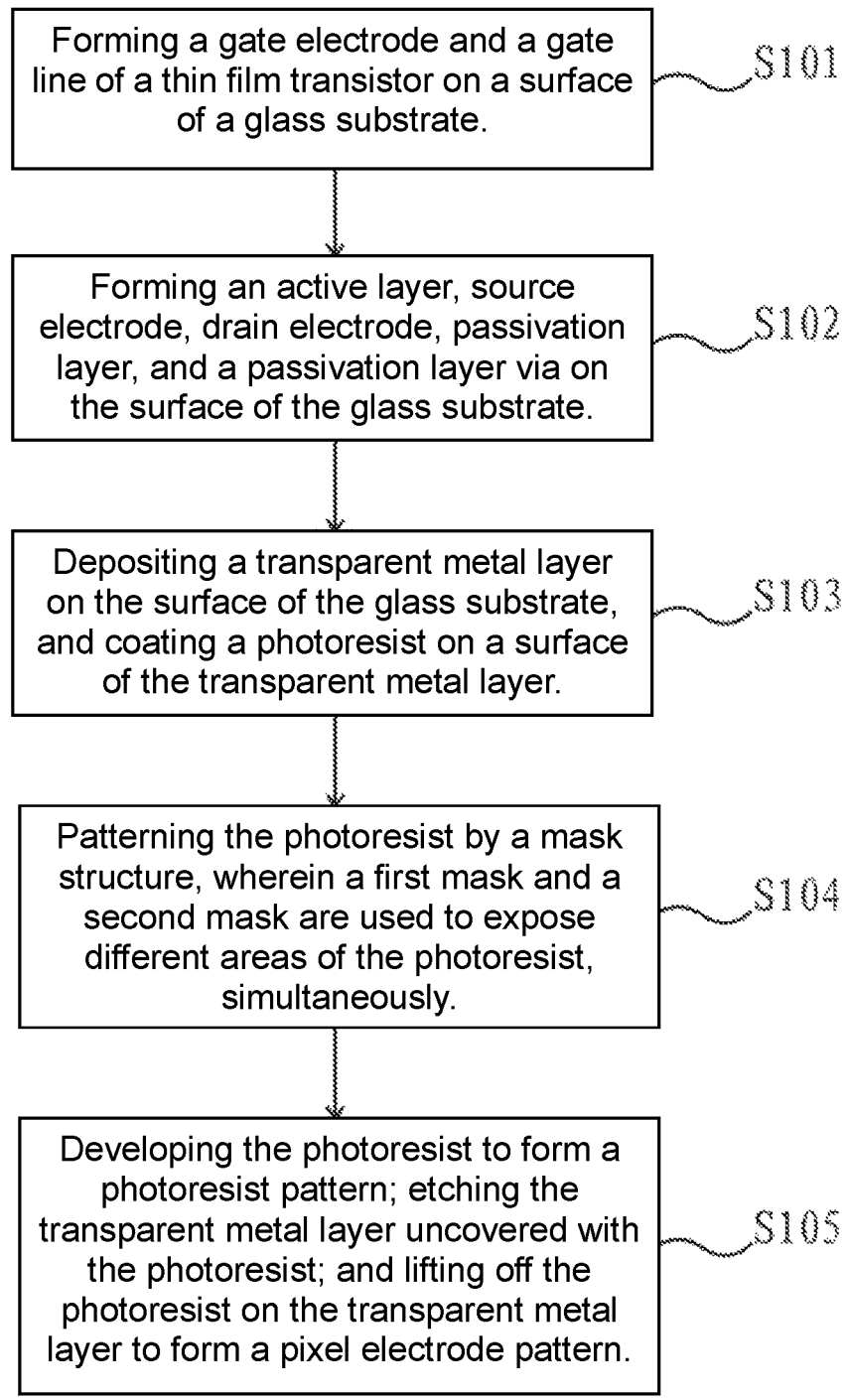
FIG. 5 is a flowchart of a manufacturing method for an array substrate of the present disclosure.

The first mask adopts a halftone mask, and the second mask adopts a single-slit diffraction mask, so as to accomplish that the first mask and the second mask have different amounts of light, and corresponding areas of an exposed photoresist have the same film thickness As shown in FIG. 5, according to the above-mentioned purpose, the present disclosure provides a manufacturing method for an array substrate. The manufacturing method includes:

Step S101: forming a gate electrode and a gate line of a thin film transistor on a surface of a glass substrate.

Step S102: forming an active layer, source electrode, drain electrode, passivation layer, and a passivation layer via on the surface of the glass substrate.

Step S103: depositing a transparent metal layer on the surface of the glass substrate, and coating a photoresist on a surface of the transparent metal layer.

Step S104: patterning the photoresist by a mask structure, wherein a first mask and a second mask are used to expose different areas of the photoresist, simultaneously.

Step S105: developing the photoresist to form a photoresist pattern; etching the transparent metal layer uncovered with the photoresist; and lifting off the photoresist on the transparent metal layer to form a pixel electrode pattern.

The advantages of the present disclosure are that: compared with a conventional mask structure, the present disclosure can accomplish that different areas of a photoresist on an array substrate can receive different amounts of light, so this can eliminate a problem where a portion of the areas of the photoresist has an enhanced exposure, which is greater than other areas caused by a light-reflection from an under-layer metal, and has a different height than the other areas. Therefore, in different areas of the photoresist having the same height is accomplished. The present disclosure can solve a technical problem: in a traditional HTM mask, because each area of the semipermeable membranes adopts the same light transmittance, when manufacturing an array substrate, film thicknesses of a photoresist in different areas on a surface of one ITO layer are different, this even causes the thinner photoresist to disappear, so that in a following dry etching process, the ITO will be etched and weakened, causing disruption in the ITO from lower to higher surfaces.

The present disclosure has been described with preferred embodiments thereof and it is understood that many changes and modifications to the described embodiment can be carried out without departing from the scope and the spirit of the invention that is intended to be limited only by the appended claims.

What is claimed is:

1. A mask structure, comprising a plurality of mask units arranged in an array and configured to form a metal pattern on a surface of an array substrate of a display panel;
wherein the mask units comprise:
a first mask configured to form a first transparent electrode in a corresponding area of the surface of the array substrate; and
a second mask connected with the first mask, and configured to form a second transparent electrode in a corresponding area of the surface of the array substrate;
wherein the first mask and the second mask have different light transmittances, and the light transmittance of the second mask is less than the light transmittance of the first mask, so as to allow in different amounts of light;
wherein the first mask comprises two slit areas which are symmetrically disposed to each other; the second mask comprises a first connecting area configured to connect the two slit areas, and a second connecting area configured to connect with one end of the first connecting area.

2. The mask structure according to claim 1, wherein the first mask and the second mask adopt a halftone mask.

3. The mask structure according to claim 1, wherein the first mask adopts a single-slit diffraction mask, and the second mask adopts a halftone mask.

4. The mask structure according to claim 3, wherein a width of a slit of the first mask is from 1.6 um to 1.8 um.

5. A manufacturing method for an array substrate, by using the mask structure according to claim 1, wherein the manufacturing method comprises steps of:
forming a gate electrode and a gate line of a thin film transistor on a surface of a glass substrate;
forming an active layer, source electrode, drain electrode, passivation layer, and a passivation layer via on the surface of the glass substrate;
depositing a transparent metal layer on the surface of the glass substrate, and coating a photoresist on a surface of the transparent metal layer;
patterning the photoresist by the mask structure, wherein the first mask and the second mask are used to expose different areas of the photoresist, simultaneously; and
developing the photoresist to form a photoresist pattern; etching the transparent metal layer uncovered with the photoresist; and lifting off the photoresist on the transparent metal layer to form a pixel electrode pattern;
wherein the first mask comprises two slit areas which are symmetrically disposed to each other; the second mask comprises a first connecting area configured to connect the two slit areas, and a second connecting area configured to connect with one end of the first connecting area.

6. The manufacturing method according to claim 5, wherein the first mask and the second mask adopt a halftone mask.

7. A mask structure, comprising a plurality of mask units arranged in an array and configured to form a metal pattern on a surface of an array substrate of a display panel;
wherein the mask units comprise:
a first mask configured to form a first transparent electrode in a corresponding area of the surface of the array substrate; and
a second mask connected with the first mask, and configured to form a second transparent electrode in a corresponding area of the surface of the array substrate;
wherein the first mask and the second mask have different light transmittances, and the light transmittance of the second mask is less than the light transmittance of the first mask, so as to allow in different amounts of light;
wherein the first mask comprises two slit areas which are symmetrically disposed to each other, and a first connecting area configured to connect the two slit areas; and the second mask comprises a second connecting area configured to connect with one end of the first connecting area.

8. The mask structure according to claim 7, wherein the first mask adopts a halftone mask, and the second mask adopts a single-slit diffraction mask.

* * * * *